(12) United States Patent
Kim (10) Patent No.: US 9,577,193 B2
(45) Date of Patent: Feb. 21, 2017

(54) METHOD OF FORMING THIN FILM AND METHOD OF MANUFACTURING ORGANIC LIGHT-EMITTING DISPLAY DEVICE

(71) Applicant: Samsung Display Co., Ltd., Yongin-si (KR)

(72) Inventor: Hanjun Kim, Yongin-si (KR)

(73) Assignee: Samsung Display Co., Ltd., Yongin (KR)

(*) Notice: Subject to any disclaimer, the term of this patent is extended or adjusted under 35 U.S.C. 154(b) by 0 days.

(21) Appl. No.: 14/877,408

(22) Filed: Oct. 7, 2015

(65) Prior Publication Data
US 2016/0284997 A1 Sep. 29, 2016

(30) Foreign Application Priority Data
Mar. 27, 2015 (KR) .................. 10-2015-0043298

(51) Int. Cl.
| H01L 21/00 | (2006.01) |
| H01L 51/00 | (2006.01) |
| H01L 51/56 | (2006.01) |
| H01L 27/32 | (2006.01) |
| H01L 51/52 | (2006.01) |

(52) U.S. Cl.
CPC ....... *H01L 51/0002* (2013.01); *H01L 27/3248* (2013.01); *H01L 51/5237* (2013.01); *H01L 51/56* (2013.01); *H01L 2227/323* (2013.01)

(58) Field of Classification Search
CPC .......................... H01L 51/0002; H01L 51/56
USPC ........................................................ 438/23
See application file for complete search history.

(56) References Cited

U.S. PATENT DOCUMENTS

| 2004/0002216 A1 | 1/2004 | Taussig et al. |
| 2006/0019504 A1 | 1/2006 | Taussig |
| 2006/0134922 A1 | 6/2006 | Taussig et al. |
| 2009/0087792 A1 | 4/2009 | Iizumi et al. |

FOREIGN PATENT DOCUMENTS

JP     2009-087760     4/2009

*Primary Examiner* — Anthony Ho
(74) *Attorney, Agent, or Firm* — H.C. Park & Associates, PLC (57) ABSTRACT

A method of forming a thin film, the method including: disposing a resist portion on a substrate, the resist portion including: a first region including a first upper surface; and a second region including a second upper surface, the first upper surface disposed higher than the second upper surface and forming a step; disposing a first protection layer covering the resist portion; exposing the first upper surface; removing the first region; disposing a first thin film on the substrate; disposing a second protection layer covering the first thin film; exposing the second upper surface; removing the second region; disposing a second thin film on the substrate; and removing the first protection layer and the second protection layer.

10 Claims, 10 Drawing Sheets

METHOD OF FORMING THIN FILM AND METHOD OF MANUFACTURING ORGANIC LIGHT-EMITTING DISPLAY DEVICE

CROSS-REFERENCE TO RELATED APPLICATION

This application claims priority from and the benefit of Korean Patent Application No. 10-2015-0043298, filed on Mar. 27, 2015, which is hereby incorporated by reference for all purposes as if fully set forth herein.

BACKGROUND

Field

Exemplary embodiments relate to a method of forming a thin film and a method of manufacturing an organic light-emitting display device using the same.

Discussion of the Background

A semiconductor device, a display apparatus, and other electronic devices generally include a plurality of thin films. A thin film may be formed by various methods including a photolithography process. The photolithography process conventionally includes an exposure process using a mask. In this regard, for the photolithography process, masks and exposure equipment are separately or additionally used, and may have a limitation in forming a thin film having micro patterns by the exposure process.

An organic light-emitting display device is a self-emitting device and thus, an additional light source is not required. Accordingly, the organic light-emitting display device may be driven at a low voltage and formed thin and light. Recently, the organic light-emitting display device has been recognized to have beneficial properties such as a wide viewing angle, a high contrast ratio, and a quick response time.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a method of forming a thin film and a method of manufacturing an organic light-emitting display device using the same.

Additional aspects will be set forth in the detailed description which follows, and, in part, will be apparent from the disclosure, or may be learned by practice of the inventive concept.

An exemplary embodiment discloses a method of forming a thin film, the method including: disposing a resist portion on a substrate, the resist portion including: a first region including a first upper surface; and a second region including a second upper surface. The first upper surface is disposed higher than the second upper surface forming a step. The method further includes disposing a first protection layer covering the resist portion; exposing the first upper surface; removing the first region; disposing a first thin film on the substrate; disposing a second protection layer covering the first thin film; exposing the second upper surface; removing the second region; disposing a second thin film on the substrate; and removing the first protection layer and the second protection layer.

An exemplary embodiment also discloses a method of manufacturing an organic light-emitting display device, the method including: disposing a resist portion on a substrate, the resist portion including: a first region; a second region; and a third region, the first region. The second region, and the third region have different heights, and the substrate includes a plurality of pixel electrodes. The method further includes disposing a first protection layer on the resist portion; exposing a first upper surface of the first region; exposing a first pixel electrode between the plurality of the pixel electrodes by removing the first region from the exposed first upper surface; disposing a first interlayer on the first pixel electrode; disposing a second protection layer covering the first interlayer; exposing a second upper surface of the second region; exposing a second pixel electrode between the plurality of pixel electrodes by removing the second region from the exposed second upper surface; disposing a second interlayer on the second pixel electrode; disposing a third protection layer covering the second interlayer; and exposing a third upper surface of the third region; exposing a third pixel electrode between the plurality of pixel electrodes by removing the third region from the exposed third upper surface; disposing a third interlayer on the third pixel electrode; and removing the first protection layer, the second protection layer, and the third protection layer, The first surface has a first height, the second surface has a second height, and the third surface has a third height, and the first height is greater than the second height and the third height, and the second height is greater than the third height.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIGS. 1, 2, 3, 4, 5, 6, 7, and 8 are schematic cross-sectional views illustrating a method of manufacturing a thin film according to an exemplary embodiment.

Figure 6:
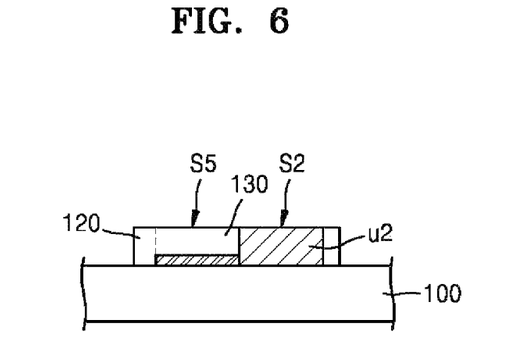
Figure 7:
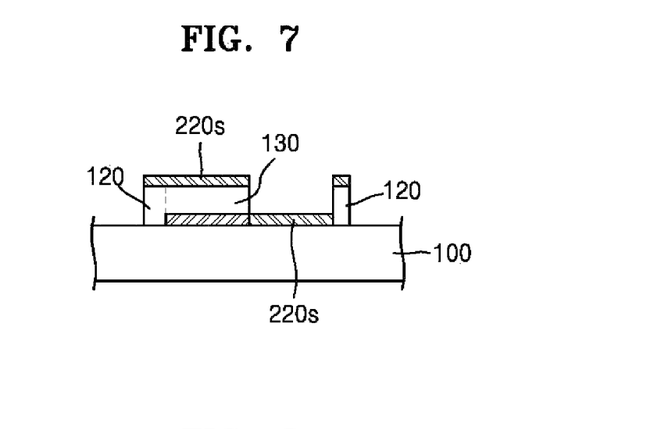
Figure 8:
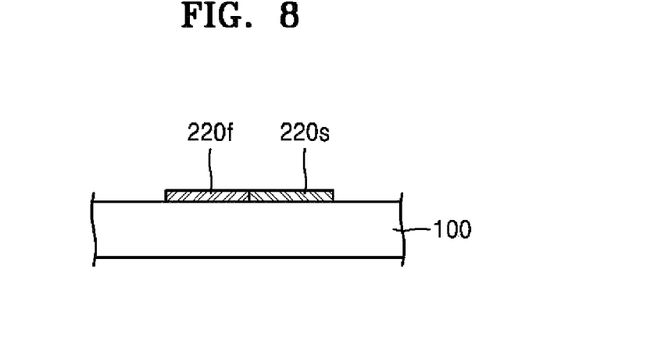

Referring to FIGS. 1 through 8, the method of manufacturing a thin film according to an exemplary embodiment may include forming a resist portion 110 including at least one first region u1 and at least one second region u2 on a substrate 100 (FIG. 1), forming a first protection layer 120 that covers the resist portion 110 (FIG. 2) and exposing a first upper surface S1 of the first region u1 (FIG. 3), removing the first region u1 and forming a first thin film 220f on the substrate 100 and the first protection layer 120 (FIG. 4), forming a second protection layer 130 that covers the resist portion 110 (FIG. 5) and then exposing a second upper surface S2 of the second region u2 (FIG. 6), removing the second region u2 and forming a second thin film 220s on the substrate 100 (FIG. 7), and removing the second protection layer 130 (FIG. 8).

Figure 1:
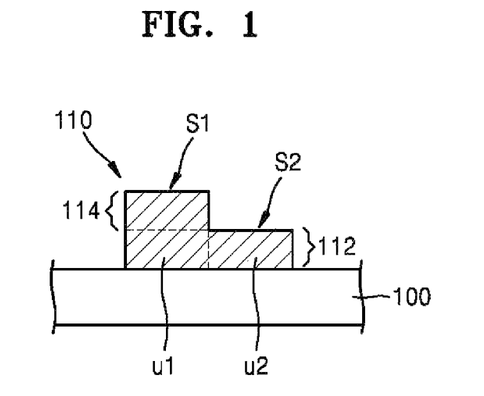
FIGS. 1, 2, 3, 4, 5, 6, 7, and 8 are schematic cross-sectional views illustrating a method of forming a thin film according to an exemplary embodiment.

Referring to FIG. 1, the resist portion 110 may include the first region u1 and the second region u2 that have different heights from each other. The first region u1 may include the first upper surface S1, and the second region u2 may include the second upper surface S2. In this regard, the first upper surface S1 and the second upper surface S2 may be provided forming a step therebetween. The first region u1 and the second region u2 may be formed to correspond to the positions of the thin films 220f and 220s to be formed.

For example, the resist portion 110 may be formed by sequentially stacking a first layer 112 and a second layer 114 on the substrate 100. The first layer 112 and the second layer 114 may be formed of the same material. The first layer 112 may have a thickness corresponding to a distance from an upper surface of the substrate 100 to the second upper surface S2, and the second layer 114 may have a thickness corresponding to a distance from the second upper surface S2 to the first upper surface S1. Also, an area of the second layer 114 may be smaller than that of the first layer 112.

According to exemplary embodiments, the first region u1 and the second region u2 of the resist portion 110 may be formed in one body by imprinting. According to the exemplary embodiments, a material for forming the resist portion 110 is disposed on the substrate 100, and the first region u1 and the second region u2 are differently exposed using a multi-tone mask and then etched to form the resist portion 110.

Figure 2:
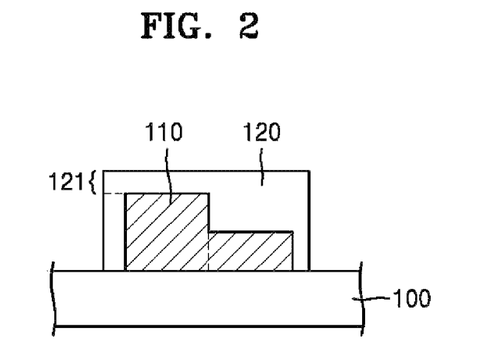

Referring to FIG. 2, the first protection layer 120 may be formed on the resist portion 110 after forming the resist portion 110. For example, the first protection layer 120 may be formed to cover the resist portion 110. The first protection layer 120 may be formed of a different material from the resist portion 110. For example, the first protection layer 120 may be dissoluble in an exclusive stripper solution.

Figure 3:
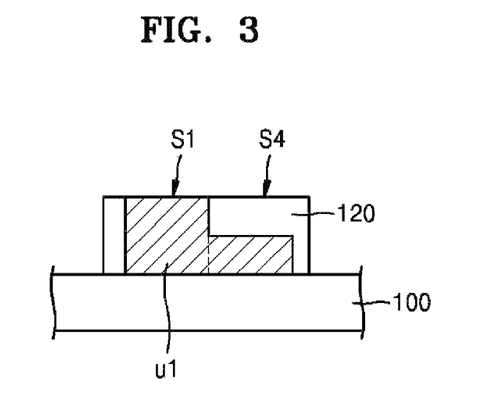
Figure 4:
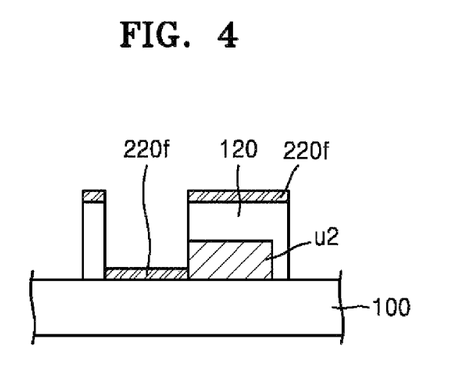

Referring to FIGS. 3 and 4, the first upper surface S1 of the first region u1 may be exposed and then the first region u1 may be removed, and the first thin film 220f may be formed on the substrate 100.

An upper portion 121 of the first protection layer 120 covering the resist portion 110 may be removed by etching and/or polishing. As a result, the first upper surface S1 of the first region u1 is exposed, and the first upper surface S1 and an upper surface S4 of the first protection layer 120 may be placed in the same plane (i.e., planarized).

The first region u1 may be removed by vertically etching from the exposed first upper surface S1. For example, the first region u1 may be removed by a method including, but not limited to, wet etching, dry etching, ion bombardment, and/or the like. When the first region u1 is removed, the second region u2 may be protected by the first protection layer 120.

When the first region u1 is disposed contacting the second region u2, removing the first region u1 by wet etching may damage the second region u2 with an etching solution. In this regard, when the first region u1 is disposed contacting the second region u2, the first region u1 may be removed by dry etching and/or ion bombardment to reduce or prevent damage to the second region u2. When the first region u1 is disposed not contacting the second region u2, the first protection layer 120 may be formed between the first region u1 and the second region u2 separating the first region u1 and the second region u2. In this regard, when the first region u1 is disposed not contacting the second region u2, the first region u1 may be removed by wet etching.

The first thin film 220f may be formed on an upper surface of the substrate 100 that is exposed from removing the first region u1. The first thin film 220f may be formed by using various methods including, but not limited to, deposition, coating, and/or the like. Here, the first thin film 220f may be formed on an upper surface of the first protection layer 120 as well as an upper surface of the exposed substrate 100.

Figure 5:
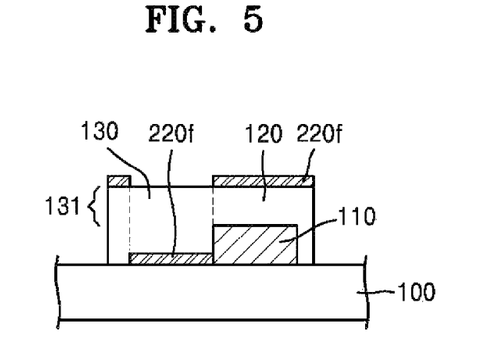

Referring to FIGS. 5 and 6, the second protection layer 130 may be formed covering the resist portion 110 after the first region u1 is removed, and the second upper surface S2 of the second region u2 may be exposed.

The second protection layer 130 may be newly formed after the first protection layer 120 is removed. According to the exemplary embodiments, the second protection layer 130 may be formed by filling the same material as the first protection layer 120 in an area where the first region u1 is removed. Accordingly, the first thin film 220f may be protected from being damaged by a solution for removing the first protection layer 120.

An upper portion 131 of the first protection layer 120 and the second protection layer 130 may be removed by etching and/or polishing. Here, the first thin film 220f formed on the upper surface of the first protection layer 120 may be also removed. Therefore, the second upper surface S2 of the second region u2 is exposed, and the second upper surface S2 and an upper surface S5 of the second protection layer 130 may be placed in the same plane (i.e., planarized).

Referring to FIGS. 7 and 8, the second thin film 220s may be formed on the substrate 100 after the second region u2 is removed, and the remaining of the first protection layer 120 and the second protection layer 130 may be removed.

The second region u2 may be removed in the same manner as for the first region u1. According to the exemplary embodiments, the second thin film 220s may be formed in the same manner as for the first thin film 220f. In this case, the second thin film 220s may be formed on an upper surface of the first protection layer 120 and the second protection layer 130 as well as on an upper surface of the exposed substrate 100. When the second thin film 220s is formed, the second protection layer 130 may cover and protect previously formed the first thin film 220f and thus, damage to the first thin film 220f during the formation of the second thin film 220s may be reduced or prevented.

The first protection layer 120 and the second protection layer 130 may be removed by using a stripper solution which may selectively remove only the first protection layer 120 and the second protection layer 130. For example, the second protection layer 130 may be removed by dipping the substrate 100 into the stripper solution containing an exclusive stripper solution.

As described above, the resist portion 110 including a plurality of regions u1 and u2 with different heights may be formed on the substrate 100, and then the regions u1 and u2 of the resist portion 110 may be sequentially removed according to their heights to form a plurality of thin films 220f and 220s on the substrate 100. As a result, the thin films 220f and 220s having micro patterns may be formed on the substrate 100 without an exposure process and using a mask.

FIGS. 1, 2, 3, 4, 5, 6, 7, and 8 illustrate an example of forming two thin films (220f and 220s), but the exemplary embodiments are not limited thereto. Three or more thin films may be formed by the method of manufacturing a thin film according to an exemplary embodiment. For example, the resist portion 110 may include three or more regions with different heights corresponding to the locations of three or more thin films, and the regions may be sequentially removed according to their heights to thus form the three or more thin films without using a mask.

FIGS. 9, 10, 11, 12, and 13 are schematic cross-sectional views illustrating a method of manufacturing a thin film according to an exemplary embodiment. Hereinafter, the method of manufacturing a thin film will be described with reference to FIGS. 9, 10, 11, 12, and 13.

Figure 9:
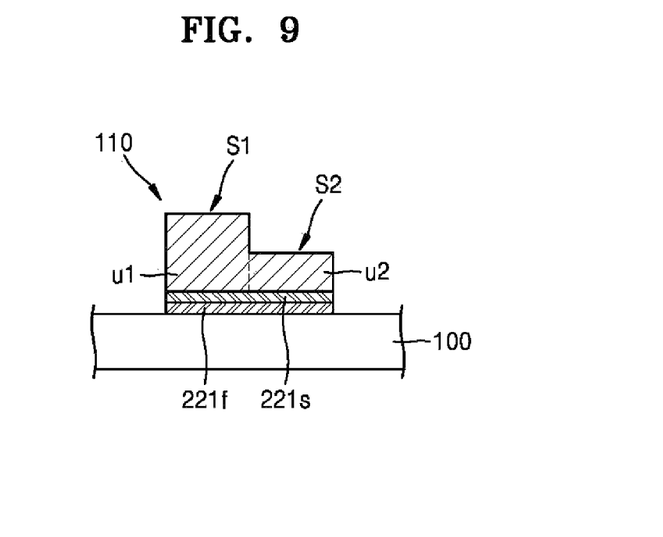
FIGS. 9, 10, 11, 12, and 13 are schematic cross-sectional views illustrating a method of forming a thin film according to an exemplary embodiment.

Comparing with the method described in FIGS. 1 through 8, the method of manufacturing a thin film described in FIGS. 9 through 13, referring to FIG. 9, may further include sequentially forming a first thin film layer 221f and a second thin film layer 221s on a substrate 100 before a resist portion 110 is formed on the substrate 100.

The first thin film layer 221f and the second thin film layer 221s may be respectively used to form a first thin film 220f and a second thin film 220s, and may be sequentially disposed on the substrate 100 by using various methods including, but not limited to, deposition, coating, and/or the like.

The resist portion 110 may be formed on the second thin film layer 221s. The first thin film layer 221f and the second thin film layer 221s may be formed on a whole surface of the substrate 100, and regions of the first thin film layer 221f and the second thin film layer 221s that does not overlap the resist portion 110 may be subsequently removed by using the resist portion 110 as a mask.

Figure 10:
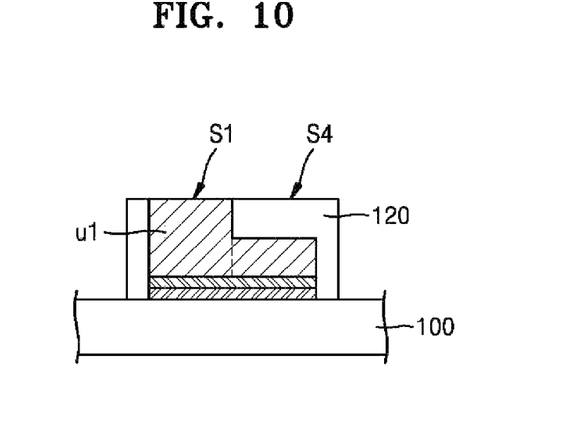

Referring to FIG. 10, a first protection layer 120 may be formed to cover the resist portion 110 and expose a first upper surface S1 of a first region u1. An upper portion of the first protection layer 120 covering the resist portion 110 may be removed by etching and/or polishing. As a result, the first upper surface S1 of the first region u1 may be exposed, and the first upper surface S1 and an upper surface S4 of the first protection layer 120 may be placed in the same plane (i.e., planarized).

Figure 11:
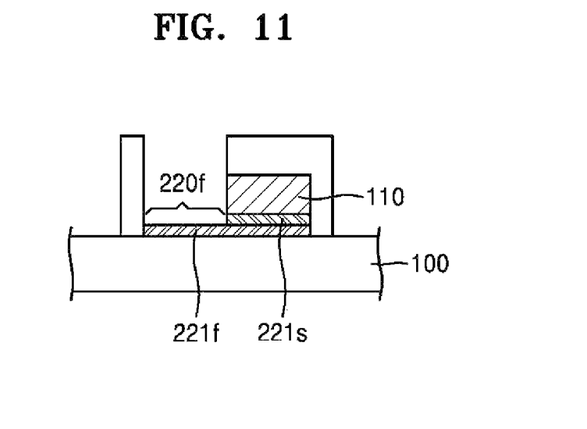

Referring to FIG. 11, the first region u1 may be removed to form the first thin film layer 220f. The first region u1 may be removed by vertically etching from the exposed first upper surface S1. For example, the first region u1 may be removed by a method including, but not limited to, wet etching, dry etching, ion bombardment, and/or the like. When the first region u1 is removed, the second region u2 may be protected by the first protection layer 120.

When the first region u1 is disposed contacting the second region u2, removing the first region u1 by wet etching may damage the second region u2 with an etching solution. In this regard, when the first region u1 is disposed contacting the second region u2, the first region u1 may be removed by dry etching and/or ion bombardment to reduce or prevent damage to the second region u2. When the first region u1 is disposed not contacting the second region u2, the first protection layer 120 may be formed between the first region u1 and the second region u2 separating the first region u1 from the second region u2. In this regard, when the first region u1 is disposed not contacting the second region u2, the first region u1 may be removed by wet etching.

When the first region u1 is removed, some portions of the second thin film layer 221s that overlap the first region u1 may be removed together to expose some portions of the first thin film layer 221f. The some portions of the first thin film layer 221f that are exposed may form the first thin film 220f.

Figure 12:
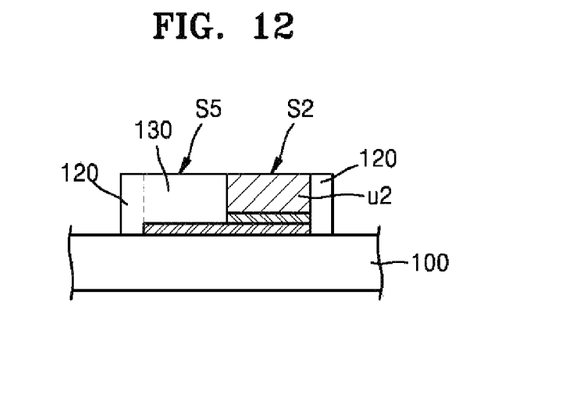

Referring to FIG. 12, after the first region u1 is removed, the second protection layer 130 covering the resist portion 110 may be formed to expose a second upper surface S2 of the second region u2.

The second protection layer 130 may be newly formed after the first protection layer 120 is removed. According to the exemplary embodiments, the second protection layer 130 may be formed by filling an area where the first region u1 is removed with the same material as the first protection layer 120. As a result, damage to the first thin film 220f by a solution for removing the first protection layer 120 may be reduced or prevented.

An upper portion of the first protection layer 120 and the second protection layer 130 may be removed by etching and/or polishing. In this regard, the second upper surface S2 of the second region u2 may be exposed, and the second upper surface S2 and an upper surface S5 of the second protection layer 130 may be placed in the same plane (i.e., planarized).

Figure 13:
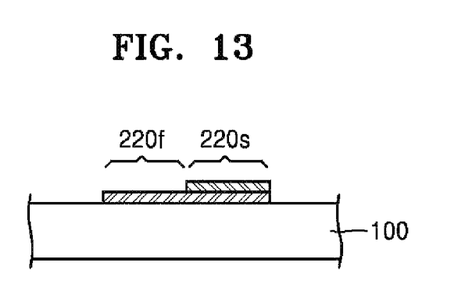

Referring to FIG. 13, the second region u2 may be removed and the remaining of the first protection layer 120 and the second protection layer 130 may also be removed to form the second thin film 220s.

The second region u2 may be removed in the same manner as for the first region u1. Here, when the second region u2 is removed, the remaining portions of the second thin film layer 221s may be exposed to form the second thin film 220s.

Figure 14:
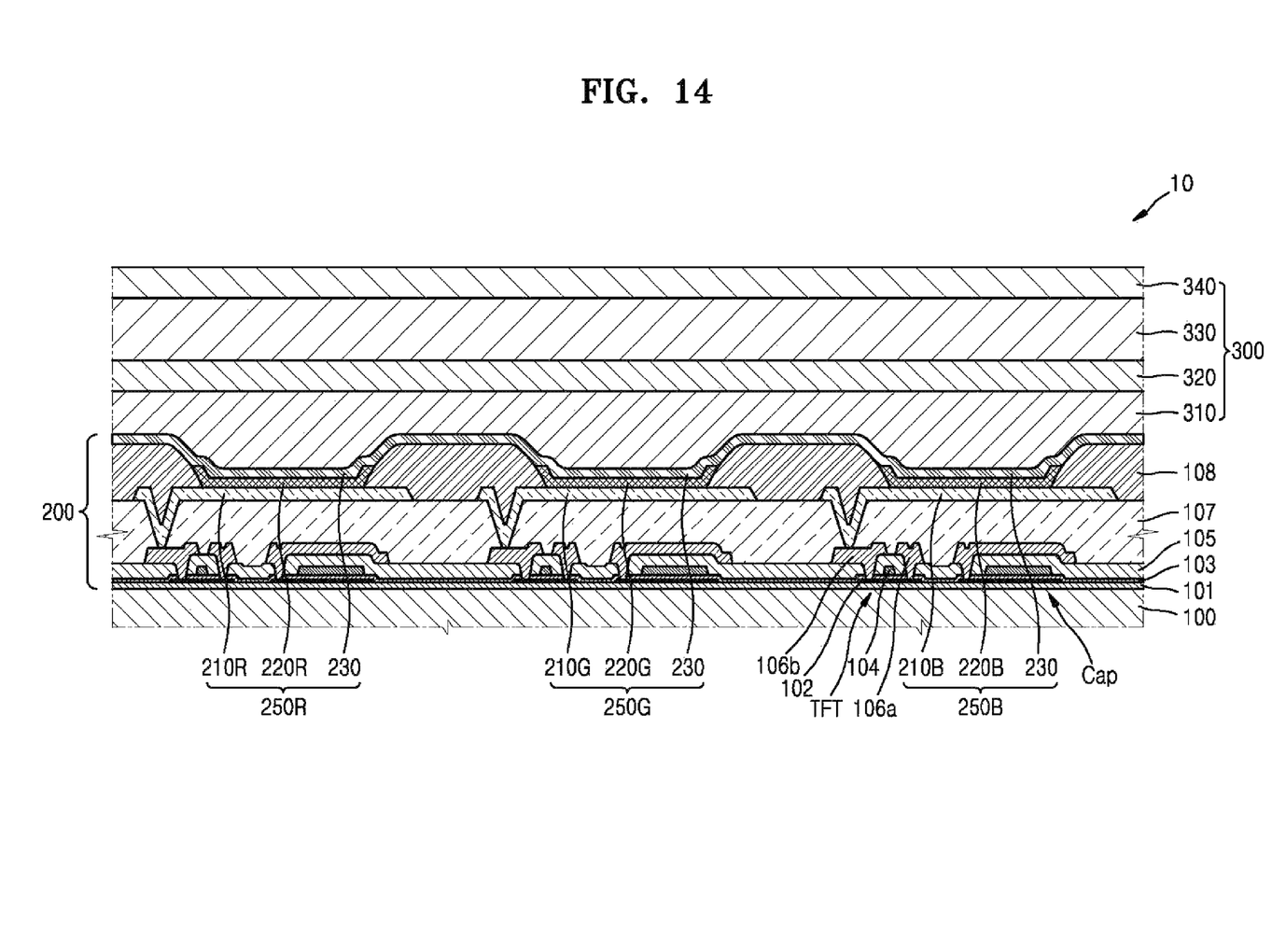
FIG. 14 is a schematic cross-sectional view illustrating an organic light-emitting display device according to another exemplary embodiment.

FIG. 14 is a schematic cross-sectional view illustrating an organic light-emitting display device according to an embodiment, and FIGS. 15, 16, 17, 18, 19, 20, 21, and 22 are schematic cross-sectional views illustrating a method of manufacturing the organic light-emitting display device in FIG. 14.

Referring to FIG. 14, an organic light-emitting display device 10 may include the substrate 100, a display unit 200 disposed on the substrate 100 and a thin film encapsulation layer 300 protecting the display unit 200.

The substrate 100 may be formed of various materials including at least one of a metal material and a plastic material including, but not limited to, polyethylene terephthalate (PET), polyethylene naphthalate (PEN), and polyimide. According to exemplary embodiments, a thin metal foil such as steel use stainless (SUS) may also be used.

A buffer layer 101 including silicon oxide, silicon nitride, and/or the like may be disposed on the substrate 100 in order to prevent the infiltration of impurities into an active layer 102 of a thin film transistor TFT. The buffer layer 101 may be deposited by using various methods including, but not limited to, a plasma enhanced chemical vapor deposition (PECVD) method, an atmospheric pressure CVD (APCVD) method, and a low pressure CVD (LPCVD) method.

A display unit 200 may include the thin film transistor TFT, a capacitor CAP, and an organic light-emitting device that is electrically connected to the thin film transistor TFT.

The thin film transistor TFT may include the active layer 102 including, but not limited to, an amorphous silicon, a polycrystalline silicon, an oxide semiconductor, and/or an organic semiconductor material, a gate electrode 104, a source electrode 106a, and the drain electrode 106b.

The active layer 102 may be formed on the buffer layer 101. The gate electrode 104 may be disposed on the active layer 102. The gate electrode 104 may be formed, for example, in a single-layered or multi-layered structure formed with materials including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and the like, by considering adhesion between neighboring layers, surface planarization level of the stacked layer, and manufacturability.

A gate insulating film 103 formed of silicon oxide and/or silicon nitride may be disposed between the active layer 102 and the gate electrode 104.

An interlayer insulating film 105 may be disposed on the gate electrode 104. The interlayer insulating film 105 may be formed in a single-layered or a multi-layered structure including, but not limited to, silicon oxide, silicon nitride, and/or the like.

The source electrode 106a and the drain electrode 106b may be disposed on the interlayer insulating film 105. Each of the source electrode 106a and the drain electrode 106b may respectively be electrically connected to the active layer 102 through contact holes formed in the interlayer insulating film 105 and the gate insulating film 103.

The source electrode 106a and the drain electrode 106b may be formed in a single-layered or a multi-layered structure formed with materials including at least one of aluminum (Al), platinum (Pt), palladium (Pd), silver (Ag), magnesium (Mg), gold (Au), nickel (Ni), neodymium Nd, iridium (Ir), chromium (Cr), lithium (Li), calcium (Ca), molybdenum (Mo), titanium (Ti), tungsten (W), and copper (Cu).

A first insulating film 107 may be disposed on the source electrode 106a and the drain electrode 106b. An organic light-emitting device may be disposed on the thin film transistor TFT, and the first insulating film 107 may substantially planarize an upper surface of the thin film transistor TFT and protect the thin film transistor TFT and other devices. The first insulating film 107 may be formed of acryl-based organic benzocyclobutene (BCB), an inorganic material, and/or the like.

A second insulating film 108 may be disposed on the thin film transistor TFT. The second insulating film 108 may be a pixel defining film. The second insulating film 108 may be disposed on the first insulating film 107, and include an opening. The second insulating film 108 may define a pixel region on the substrate 100.

The second insulating film 108 may be, for example, provided as an organic insulating film. The organic insulating film may include an acryl-based polymer including at least one of poly(methyl methacrylate) (PMMA) or polystyrene (PS), a polymer derivative having a phenol group, an imide-based polymer, an aryl ether-based polymer, an amide-based polymer, a fluoro-based polymer, a p-xylene-based polymer, and a vinyl alcohol-based polymer.

Organic light-emitting devices for forming a red sub-pixel 250R, a green sub-pixel 250G, and a blue sub-pixel 250B may be disposed on the pixel region defined by the second insulating film 108. The red sub-pixel 250R may include a red pixel electrode 210R, a red light-emitting interlayer 220R and an opposite electrode 230; the green sub-pixel 250G may include a green pixel electrode 210G, a green light-emitting interlayer 220G and the opposite electrode 230; and the blue sub-pixel 250B may include a blue pixel electrode 210G, a blue light-emitting interlayer 220B and the opposite electrode 230.

The red, green and blue pixel electrodes 210R, 210G, and 210B may be respectively connected to the thin film transistors TFT and be formed with a transparent electrode or a reflective electrode. When each of the red, green and blue pixel electrodes 210R, 210G, and 210B is a transparent electrode, Indium Tin Oxide (ITO), Indium Zinc Oxide (IZO), Zinc Oxide (ZnO), Indium(III) Oxide ($In_2O_3$), Indium Gallium Oxide (IGO) and/or Aluminum doped Zinc Oxide (AZO) may be used. When each of the red, green and blue pixel electrodes 210R, 210G, and 210B is a reflective electrode, a reflective film formed of at least one of, but not limited to, Silver (Ag), Magnesium (Mg), Aluminum (Al), Plutonium (Pt), Lead (Pd), Gold (Au), Nickel (Ni), Neodymium (Nd), Iridium (Ir), Chromium (Cr), and a combination thereof, and a layer formed of ITO, IZO, ZnO, $In_2O_3$, IGO or AZO may be provided. However, exemplary embodiments are not limited thereto, and the pixel electrodes may be formed of various materials having various structures.

The red light-emitting interlayer 220R, the green light-emitting interlayer 220G, and the blue light-emitting interlayer 220B that are respectively included in the red sub-pixel 250R, the green sub-pixel 250G, and the blue sub-pixel 250B, may each include an emission layer (EML) for emitting red, green, and blue light, respectively. In addition, a hole injection layer (HIL), a hole transport layer (HTL), an electron transport layer (ETL), electron injection layer (EIL), and the like may be formed in a single-layered or multi-layered structure. However, the red, green and blue light-emitting interlayers 220R, 220G, and 220B are not limited thereto and may be formed having various structures.

The opposite electrode 230 may be a common electrode for the red sub-pixel 250R, the green sub-pixel 250G and the blue sub-pixel 250B. The opposite electrode 230 may be formed as a transparent electrode or a reflective electrode.

When the opposite electrode 230 is a transparent electrode, the opposite electrode 230 may include a layer formed of a metal having a low work function including, but not limited to, Lithium (Li), Calcium (Ca), Lithium Fluoride/Calcium (LiF/Ca), Lithium Fluoride/Aluminum (LiF/Al), Aluminum (Al), Silver (Ag), Magnesium (Mg) and a combination thereof, and a transparent conductive layer formed of ITO, IZO, ZnO or $In_2O_3$. When the opposite electrode 230 is a reflective electrode, the opposite electrode 230 may include a layer formed of Li, Ca, LiF/Ca, LiF/Al, Al, Ag, Mg and a combination thereof. However, exemplary embodiments are not limited thereto and the opposite electrode 230 may be formed in various ways using various materials.

A thin film encapsulation layer 300 may seal a display unit 200 to reduce or prevent infiltration of external oxygen and water into the display unit 200. The thin film encapsulation layer 300 may include a plurality of organic films 310 and 330 and a plurality of inorganic films 320 and 340. For example, the organic films 310 and 330 and the inorganic films 320 and 340 may be alternately stacked to form a multi-layered structure.

The organic films 310 and 330 may include materials including at least one of an acrylic resin, a methacrylic resin, polyisoprene, a vinyl resin, an epoxy resin, a urethane resin, a cellulosic resin, and a perylene resin.

The inorganic films 320 and 340 may include materials including at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

FIGS. 15, 16, 17, 18, 19, 20, 21, and 22 are schematic cross-sectional views illustrating a method of manufacturing the organic light-emitting display device in FIG. 14. Hereinafter, the method of manufacturing the organic light-emitting display device in FIG. 14 will be described with reference to FIGS. 14, 15, 16, 17, 18, 19, 20, 21, and 22.

Figure 15:
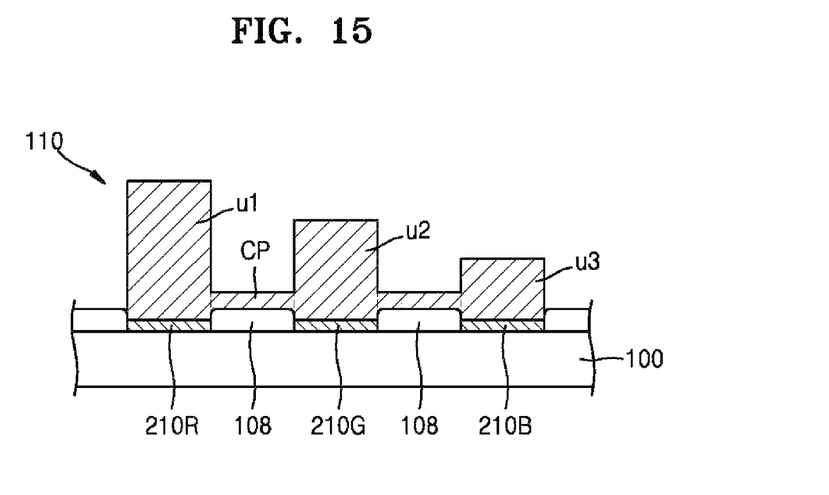
FIGS. 15, 16, 17, 18, 19, 20, 21, and 22 are schematic cross-sectional views illustrating a method of manufacturing the organic light-emitting display device of FIG. 14.

Referring to FIG. 15, the resist portion 110 may be formed on the substrate 100 where the red, green and blue pixel electrodes 210R, 210G, and 210B are formed. The thin film transistors TFT connected to the red, green and blue pixel electrodes 210R, 210G, and 210B are formed on the substrate 100, and the second insulating film 108 may be disposed between the red, green, and blue pixel electrodes 210R, 210G, and 210B.

The resist portion 110 may include a plurality of regions with different heights. The plurality of regions may be formed corresponding to locations of thin films to be formed. In detail, when the thin films to be formed are the red, green and blue light-emitting interlayers 220R, 220G, and 220B, which are disposed spaced away from each other, the resist portion 110 may include a first region u1, a second region u2, and a third region u3 which are disposed spaced away and have different heights. Also, connecting portions CP disposed corresponding to the second insulating film 108 may be formed between the first region u1 and the second region u2 and between the second region u2 and the third region u3. However, the connecting portions CP may not necessarily be formed therebetween.

Figure 16:
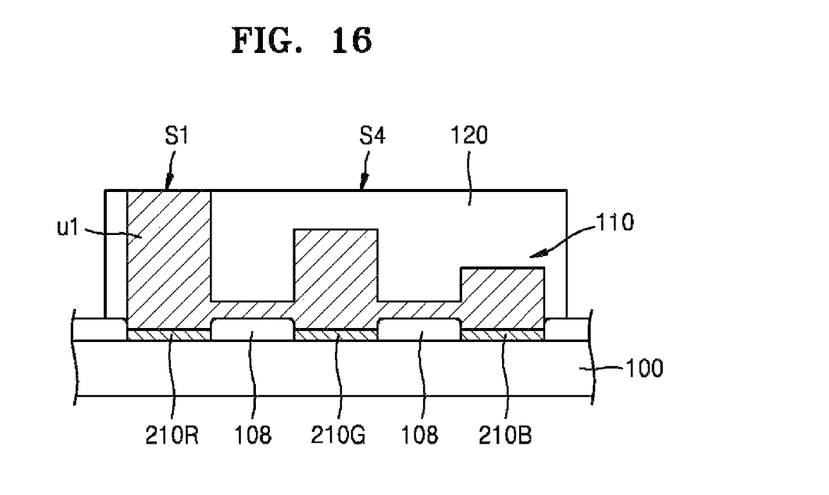

Referring to FIG. 16, after the resist portion 110 is formed, a first protection layer 120 may be formed to cover the resist portion 110, and then a first upper surface S1 of the first region u1, which has the highest height, may be exposed.

An upper portion of the first protection layer 120 covering the resist portion 110 may be removed by etching and/or polishing. In this regard, the first upper surface S1 of the first region u1 is exposed, and the first upper surface S1 and an upper surface S4 of the first protection layer 120 may be placed in the same plane (i.e., planarized).

Figure 17:
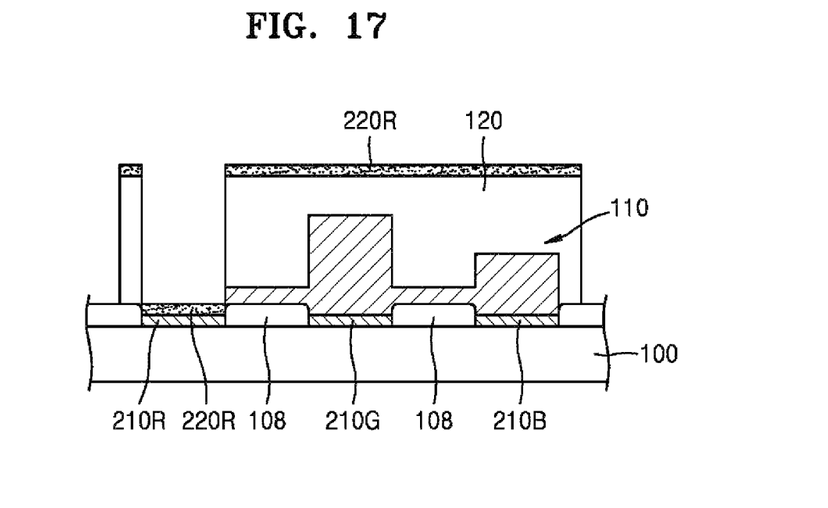

Referring to FIG. 17, after the first region u1 is removed, a first pixel electrode 210R is exposed and then a first interlayer 220R is formed on the first pixel electrode 210R.

The first region u1 may be removed by wet etching, dry etching, ion bombardment, and/or the like. When the first region u1 is removed, the second region u2 and the third region u3 may be protected by the first protection layer 120.

Since the first protection layer 120 is formed between the first region u1 and the second region u2 and between the second region u2 and the third region u3, the second region u2 and the third region u3 may be protected from being damaged by an etching solution when the first region u1 is removed by wet etching. In this case, the first protection layer 120 and the resist portion 110 may be formed of a different material, and may be selectively etched. For example, when one of the first protection layer 120 and the resist portion 110 is formed of a water-soluble material such as polyvinyl alcohol, the other may be formed of an water-insoluble material such as acrylate.

The first interlayer 220R may include, for example, an emission layer (EML) for emitting red light, and may also include a hole injection layer (HIL), a hole transport layer (HTL), an electron transport layer (ETL), an electron injection layer (EIL), and/or the like. The first interlayer 220R may be formed by using various methods such as deposition, coating, and/or the like. The first interlayer 220R may be formed on an upper surface of the first protection layer 120 as well as on an upper surface of the first pixel electrode 210R.

Figure 18:
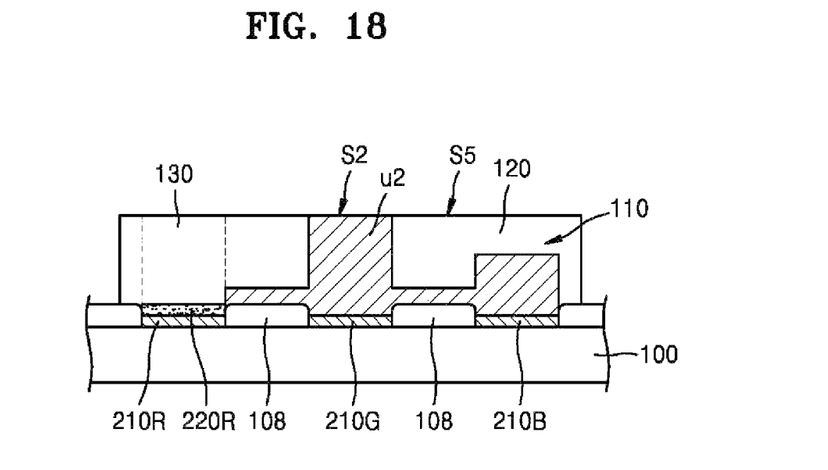

Referring to FIG. 18, after the first region u1 is removed, the second protection layer 130 may be formed covering the resist portion 110, and a second upper surface S2 of the second region u2 having the second highest height may be exposed.

The second protection layer 130 may be formed, for example, by filling an area where the first region u1 is removed, using the same material as that of the first protection layer 120. Also, an upper portion of the first protection layer 120 and the second protection layer 130 may be removed by etching and/or polishing. Here, the first interlayer 220R formed on the upper surface of the first protection layer 120 may be also removed. In this regard, the second upper surface S2 of the second region u2 is exposed, and the second upper surface S2 and an upper surface S5 of the second protection layer 130 may be placed in the same plane (i.e., planarized).

Figure 19:
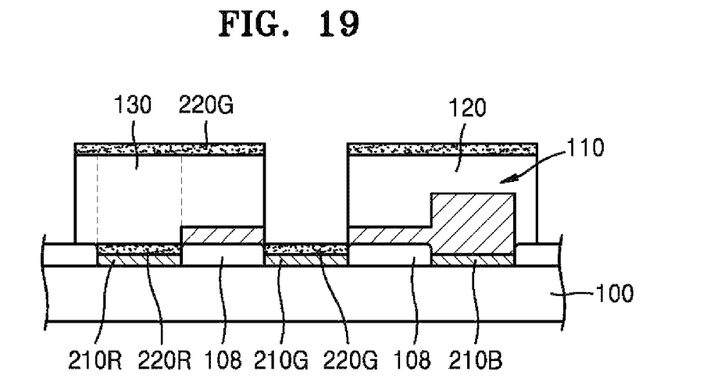

Referring to FIG. 19, after the second region u2 of the resist portion 110 is removed, a second pixel electrode 210G is exposed and a second interlayer 220G is formed thereon.

The second region u2 may be removed in the same manner as for the first region u1. Also, the second interlayer 220G may be formed in the same manner as for the first interlayer 220R. Here, the second interlayer 220G may be formed on an upper surface of the second protection layer 130 as well as on an upper surface of the second pixel electrode 210G.

Figure 20:
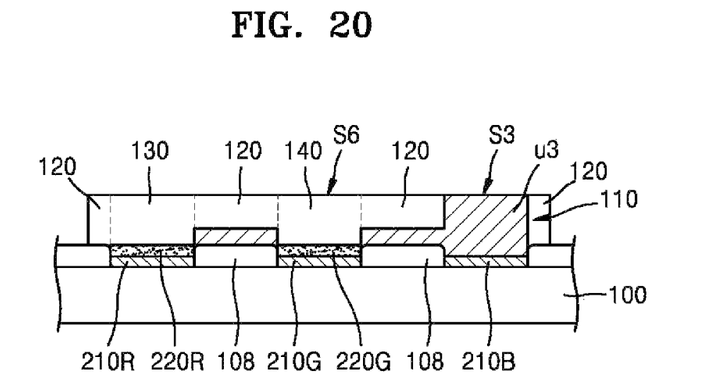

Referring to FIG. 20, after the second region u2 is removed, a third protection layer 140 may be formed covering the resist portion 110, and a third upper surface S3 of the third region u3 that has the lowest height may be exposed.

The third protection layer 140 may be formed, for example, by filling an area where the second region u2 is removed, using the same material as for the first protection layer 120. Also, an upper portion of the first protection layer 120, the second protection layer, and the third protection layer 140 may be removed by etching and/or polishing.

Here, the second interlayer 220G formed on the upper surface of the second protection layer 130 may be also removed. In this regard, the third upper surface S3 of the third region u3 is exposed, and the third upper surface S3 and an upper surface S6 of the third protection layer 140 may be placed in the same plane (i.e., planarized).

Figure 21:
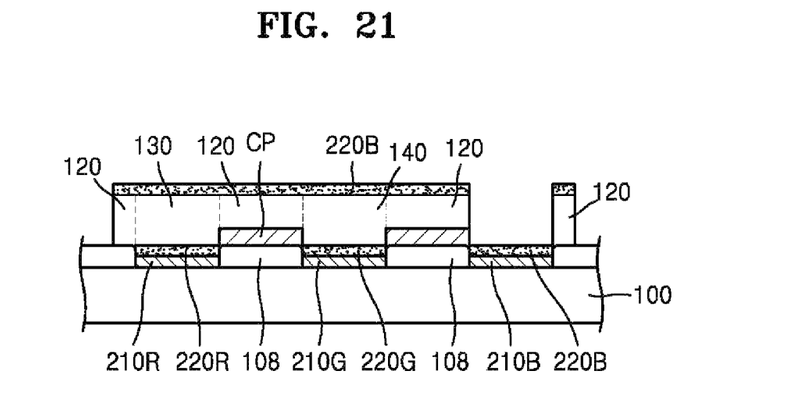
Figure 22:
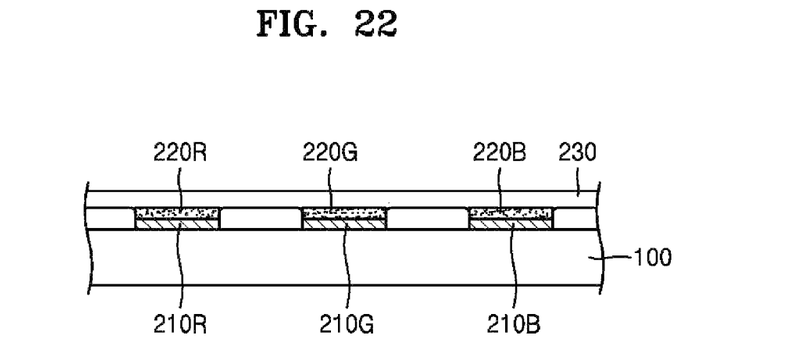

Referring to FIGS. 21 and 22, after the third region u3 is removed, a third interlayer 220B may be formed on a third pixel electrode 210B and then the remaining portions of the first protection layer 120, the second protection layer 130, and the third protection layer 140 are removed. Subsequently, an opposite electrode 230 may be formed on the first interlayer 220R, the second interlayer 220G, and the third interlayer 220B, and the thin film encapsulation layer may be formed on the opposite electrode 230.

After the first protection layer 120, the second protection layer 130, and the third protection layer 140 are removed, the connecting portions CP on the second insulating film 108 may also be removed. The connecting portions CP, however, may not be removed to provide additional insulation between the red, green, and blue pixel electrodes 210R, 210G, and 210B. Also, when the resist portion 110 is formed of a black material, the connecting portions CP may serve as a black matrix. According to exemplary embodiments, the connecting portions CP may be removed directly after forming the resist portion 110.

As described above, according to one or more exemplary embodiments, the resist portion 110 including a plurality of regions u1, u2, and u3 having different heights is formed on the substrate 100, and then the plurality of regions u1, u2, and u3 of the resist portion 110 are sequentially removed according to height. As a result, the first interlayer 220R, the second interlayer 220G and the third interlayer 220B may be formed without the exposure process using a mask.

In addition, when the first interlayer 220R, the second interlayer 220G, and the third interlayer 220B are sequentially formed, a thin film previously formed may be protected by disposing a protection layer, and thus damage to each thin film from the subsequent process of forming other thin films may be reduced or prevented. In this regard, damage of the first interlayer 220R, the second interlayer 220G, and the third interlayer 220B may be reduced or prevented and thus, the reliability of the organic light-emitting display device 10 may be improved.

However, the exemplary embodiments of the method of forming the red, green, and blue interlayers 220R, 220G, and 220B of the organic light-emitting display device 10 are not limited to the above description. Various thin films of the organic light-emitting display device 10 may be formed by using the method of manufacturing the organic light-emitting display device according to one or more exemplary embodiments.

As described above, according to one or more exemplary embodiments, a plurality of thin films may be formed without the exposure process using a mask. In addition, when sequentially forming the thin films, a thin film previously formed may not be damaged during the subsequent process of forming another thin film.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing an organic light-emitting display device, the method comprising:
    disposing a resist portion on a substrate, the resist portion comprising: a first region; a second region; and a third region, the first region, the second region, and the third region having different heights, and the substrate comprising a plurality of pixel electrodes;
    disposing a first protection layer on the resist portion;
    exposing a first upper surface of the first region;
    exposing a first pixel electrode between the plurality of the pixel electrodes by removing the first region from the exposed first upper surface;
    disposing a first interlayer on the first pixel electrode;
    disposing a second protection layer covering the first interlayer;
    exposing a second upper surface of the second region;
    exposing a second pixel electrode between the plurality of pixel electrodes by removing the second region from the exposed second upper surface;
    disposing a second interlayer on the second pixel electrode;
    disposing a third protection layer covering the second interlayer; and
    exposing a third upper surface of the third region;
    exposing a third pixel electrode between the plurality of pixel electrodes by removing the third region from the exposed third upper surface;
    disposing a third interlayer on the third pixel electrode; and
    removing the first protection layer, the second protection layer, and the third protection layer,
    wherein the first upper surface has a first height, the second upper surface has a second height, and the third upper surface has a third height, and the first height is greater than the second height and the third height, and the second height is greater than the third height.

2. The method of claim 1, wherein the exposing the first upper surface comprises removing a first upper portion of the first protection layer,
    wherein the exposing the second upper surface comprises removing a second upper portion of the first protection layer and the second protection layer,
    wherein the exposing the third upper surface comprises removing a third upper portion of the first protection layer, the second protection layer, and the third protection layer, and
    wherein the first upper portion of the first protection layer, the second upper portion of the first protection layer and the second protection layer, and the third upper portion of the first protection layer, the second protection layer, and the third protection layer are removed by etching or polishing.

3. The method of claim 2, wherein removing the first upper portion of the first protection layer comprises: forming a fourth upper surface on the first protection layer in the same plane with the first upper surface,
    wherein removing the second upper portion of the first protection layer and the second protection layer comprises: forming a fifth upper surface on the first protection layer and the second protection layer in the same plane with the second upper surface, and
    wherein removing the third upper portion of the first protection layer, the second protection layer, and the third protection layer comprises: forming a sixth upper surface on the first protection layer, the second protection layer, and the third protection layer in the same plane with the third upper surface.

4. The method of claim 1, wherein the second protection layer is formed by filling the same material as the first protection layer in an area where the first region is removed, and
    wherein the third protection layer is formed by filling the same material as the first protection layer in an area where the second region is removed.

5. The method of claim 1, wherein the organic light-emitting display device comprises a plurality of sub-pixels configured to emit different colors, and
    the first region, the second region, and the third region correspond with the plurality of sub-pixels.

6. The method of claim 1, further comprising:
    disposing an opposite electrode on the first interlayer, the second interlayer, and the third interlayer.

7. The method of claim 6, further comprising:
    disposing a thin film encapsulation layer on the opposite electrode.

8. The method of claim 6, further comprising
    disposing a plurality of thin film transistors on the substrate, the plurality of thin film transistors electrically connected to the plurality of pixel electrodes.

9. The method of claim 1, wherein the resist portion further comprising connecting portions disposed on an insulating film, the connecting portions connecting the first region, the second region, and the third region, and
    wherein the insulating film is disposed between the plurality of pixel electrodes, separating each of the plurality of pixel electrodes.

10. The method of claim 9, wherein the removing the first protection layer, the second protection layer, and the third protection layer comprises: removing the connecting portions.

* * * * *